(12) United States Patent
Bierhuizen

(10) Patent No.: US 8,907,364 B2
(45) Date of Patent: Dec. 9, 2014

(54) LED PACKAGE COMPRISING ENCAPSULATION

(75) Inventor: Serge Joel Armand Bierhuizen, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/993,733

(22) PCT Filed: Dec. 29, 2011

(86) PCT No.: PCT/IB2011/056005
§ 371 (c)(1),
(2), (4) Date: Jun. 13, 2013

(87) PCT Pub. No.: WO2012/101488
PCT Pub. Date: Aug. 2, 2012

(65) Prior Publication Data
US 2013/0285082 A1  Oct. 31, 2013

Related U.S. Application Data

(60) Provisional application No. 61/433,306, filed on Jan. 17, 2011.

(51) Int. Cl.
*H01L 33/60* (2010.01)
*H01L 33/52* (2010.01)
*H01L 33/48* (2010.01)
*H01L 33/50* (2010.01)
*H01L 25/075* (2006.01)

(52) U.S. Cl.
CPC ....... *H01L 33/52* (2013.01); *H01L 2224/48247* (2013.01); *H01L 2224/48091* (2013.01); *H01L 33/50* (2013.01); *H01L 33/486* (2013.01); *H01L 2224/16225* (2013.01); *H01L 33/60* (2013.01); *H01L 25/0753* (2013.01)
USPC ............................................. 257/98; 438/28

(58) Field of Classification Search
USPC ............................................................. 438/28
See application file for complete search history.

(56) References Cited

U.S. PATENT DOCUMENTS

| 2004/0041165 A1 | 3/2004 | Fukasawa et al. |
| 2005/0045903 A1 | 3/2005 | Abe et al. |
| 2010/0059782 A1* | 3/2010 | Fujitomo et al. ................ 257/98 |
| 2010/0096746 A1 | 4/2010 | Tseng et al. |

FOREIGN PATENT DOCUMENTS

| DE | 202010008705 U1 | 2/2011 |
| EP | 2161765 A2 | 3/2010 |

* cited by examiner

*Primary Examiner* — Stephen W Smoot

(57) ABSTRACT

Light emitting elements (110) are situated on a film (210), then surrounded by a reflective structure (250) that is placed or formed on the film (210). Thereafter, the reflective structure (250) is filled with an encapsulant (270), affixing the light emitting element (110) within the reflective structure (250). The film (210) may then be removed, exposing the contacts (230) for coupling the light emitting element (110) to an external power source. The encapsulated light emitting elements (110) within the reflective structure (250) are diced/singulated to provide the individual light emitting devices. The encapsulant (270) may be molded or otherwise shaped to provide a desired optical function.

17 Claims, 4 Drawing Sheets

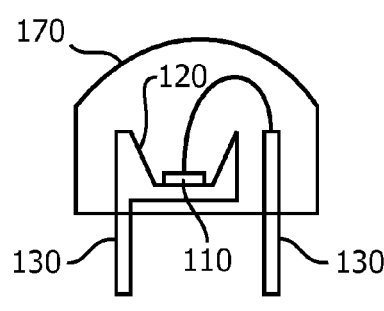
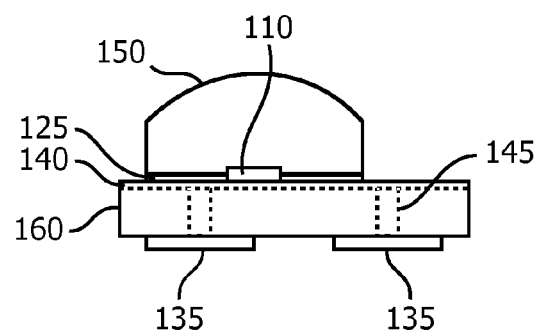
Prior art
FIG. 1A
Prior art
FIG. 1B
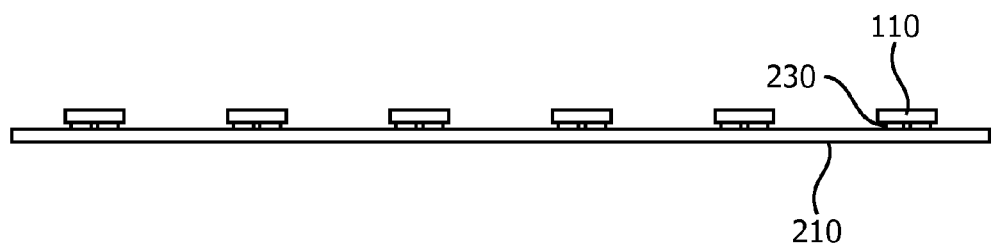
FIG. 2A
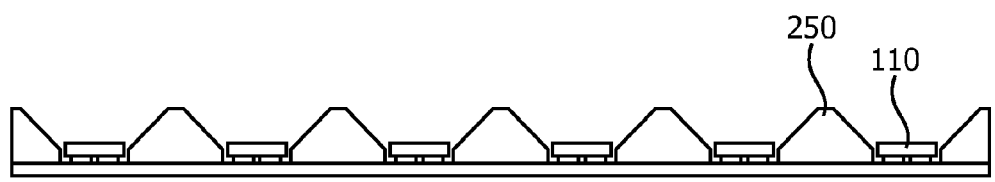
FIG. 2B

LED PACKAGE COMPRISING ENCAPSULATION

FIELD OF THE INVENTION

This invention relates to the field of light emitting devices, and in particular to a light emitting device that is encapsulated with a substantially flat-topped encapsulant having a light exit surface that is larger than its light entrance surface, and a method for producing the device.

BACKGROUND OF THE INVENTION

Solid state light emitting devices (LEDs) are being used in an ever increasing variety of applications, and with increased market volume, the cost per device becomes increasingly more important. In like manner, with increased market competition, the relative performance of competing products also becomes increasingly important.

To improve light output efficiency, light emitting devices often include reflective elements that serve to reflect stray light in the intended direction. FIGS. 1A and 1B illustrate example light emitting devices with reflective elements.

In FIG. 1A, the light emitting element 110 is placed in a reflective cup 120, which often also serves as a contact 130 for coupling the element to an external power source. The element 110 will typically include a sandwich configuration of light emitting material between two electrodes, a lower electrode being connected to the contact 130 via the reflective cup 120, and an upper electrode being wire bonded to the other contact 130. The light emitting element 110, the reflective cup 120, and the electrodes 130 are subsequently encapsulated in an encapsulation material 170, such as an epoxy that is molded in the shape of a lens.

In FIG. 1B, the light emitting element 110 is mounted on a substrate 160, and the area surrounding the element 110 is coated with a reflective layer 125, such as a white dielectric. In this example, circuit traces 140 are coupled to the element 110, and through-hole vias 145 couple the traces 140 to electrodes 135 at the lower surface of the substrate 160. In this manner, the light emitting device can be mounted directly upon a printed circuit board or other mounting surface.

The example device of FIG. 1A advantageously includes a reflective cup that is shaped to direct the light output in a concentrated beam, but the manufacturing process requires support of the cup 120 while the light emitting element 110 is mounted and wire bonded, and subsequently encapsulated. The manufacture of example device of FIG. 1B, on the other hand, may be simpler than the manufacture of the device of FIG. 1A, but the encapsulant 150 generally needs to be substantially large and curved for high extraction efficiency and the reflective surface 125 does not direct the light as well as the reflective cup 120.

SUMMARY OF THE INVENTION

It would be advantageous to provide a simpler means of manufacturing a light emitting device with a reflective structure that enhances the light output and directs the light forward.

This advantage, and/or other advantages, may be realized by a manufacturing process that includes mounting the light emitting elements on a film, then surrounding each light emitting element on the film with a reflective structure. Thereafter, the reflective structure is filled with an encapsulant, affixing the light emitting element within the reflective structure. The film may then be removed, exposing the contacts for coupling the light emitting element to an external power source. The encapsulated light emitting elements within the reflective structure are diced/singulated to provide the individual light emitting devices. The encapsulant may be molded or otherwise shaped to provide a desired optical function.

BRIEF DESCRIPTION OF THE DRAWINGS

The invention is explained in further detail, and by way of example, with reference to the accompanying drawings wherein:

FIGS. 1A and 1B illustrate example prior art light emitting devices.

FIGS. 2A-2D illustrate an example manufacture of a light emitting device having an integral reflective structure.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

FIGS. 2A-2D illustrate an example manufacture of light emitting devices with integral reflective structure.

FIG. 2A illustrates the placement of light emitting elements 110 on a film 210. In a preferred embodiment, the light emitting elements 110 are structured to have contacts 230 on their lower surface, to facilitate coupling to an external power source upon removal of the film 210. The elements 110 may be placed on the film 210 using a conventional pick and place process. Alternatively, a block of elements 110 may be placed on an elastic film that is subsequently stretched to separate the elements 110 to situate the elements 110 appropriately. The term 'film' is used herein in a general sense to distinguish it from a 'substrate', in that the film is not necessarily required to provide structural support, per se. A flexible film is particularly well suited for this process, due to its lower cost compared to a rigid film, but a rigid film may be well suited for repeated use of the film.

Figure 2C:
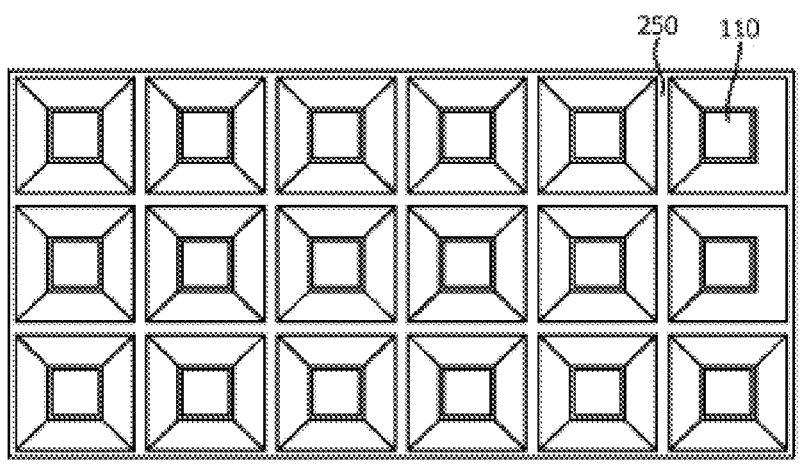

At FIG. 2B, reflective structures 250 are situated on the film 210, surrounding each light emitting element 110. A top view of an example frame of light emitting devices is illustrated in FIG. 2C. In this example, the structure 250 includes a set of planes that are angled with respect to the corresponding light emitting element 110. These angled side walls serve to efficiently reflect the light for additional light extraction and direct the light forward from the light emitting element 110 that is reflected by the reflective structure 250.

The structure 250 may be added to the film 210 in a number of ways. A preformed frame of reflective material, with openings for the light emitting elements 110, may simply be placed upon the film 210. Alternatively, the structure 250 may be molded directly upon the film 210, using a mold that is patterned to avoid placing the reflective material at the locations of the elements 110. A slurry of white dielectric material, for example, may be injection molded upon the film 210 using techniques common in the art of semiconductor fabrication. Alternatively, a reflective coating may be applied atop a shaped structure to form the reflective structure 250.

Also alternatively, instead of providing or forming a frame that includes multiple reflective structures, individual reflective structures 250 may be placed on the film using a conventional pick and place process. Other techniques for placing or forming reflective structures that surround the light emitting elements 110 on the film will be evident to one of skill in the art in view of this disclosure.

Figure 2D:
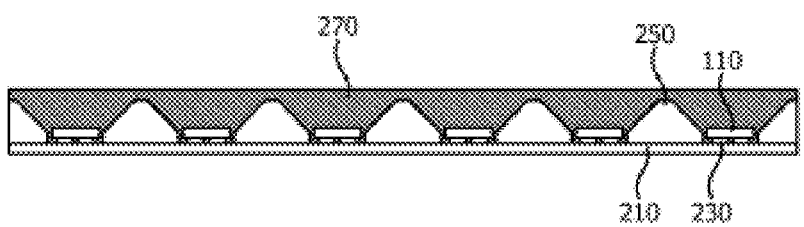

After situating the light emitting elements 110 and reflective structures 250 on the film 210, an encapsulant 270 is applied, filling the reflective structures 250 and affixing the light emitting elements 110 to these reflective structures 250, as illustrated in FIG. 2D. Once the encapsulant affixes the light emitting elements 110 to the reflective structures 250, the film 210 may be removed, exposing the contacts 230 for coupling to an external power source.

To further facilitate coupling to the contacts 230, a lower layer of the reflective structure 250 may comprise an easily removable material, so that upon removal, the contacts 230 will extend slightly below the remaining surface of the structure 250. Such a sacrificial removable layer applied to the reflective structure and/or the bottom contacts of the LED chip may also be used to remove any excess material from the film after removal.

As illustrated in FIG. 2D, the upper surface of the encapsulant may be flat. In many applications, the light emitting device is coupled to a rectilinear waveguide or other structure having a relatively flat light input surface. For example, edge lit waveguides are increasingly being used to provide backlighting to displays, and surface lit waveguides are increasingly being used to provide high intensity edge-emitting lamps. By providing a flat surface on the LED that corresponds to a flat surface on a transmitting element, the light coupling efficiency into the waveguide is increased. By providing a reflective structure about the light emitting element, the size and shape of the output surface of light emitting device may be customized to conform to the transmitting element, substantially independent of the size and shape of the light emitting element.

Figure 3A:
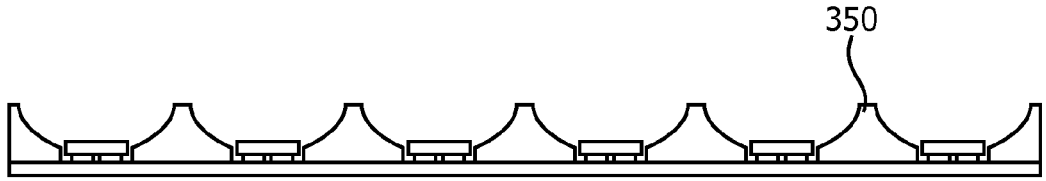
FIGS. 3A-3C illustrate example alternative features of a light emitting device having an integral reflective structure.
Figure 3B:
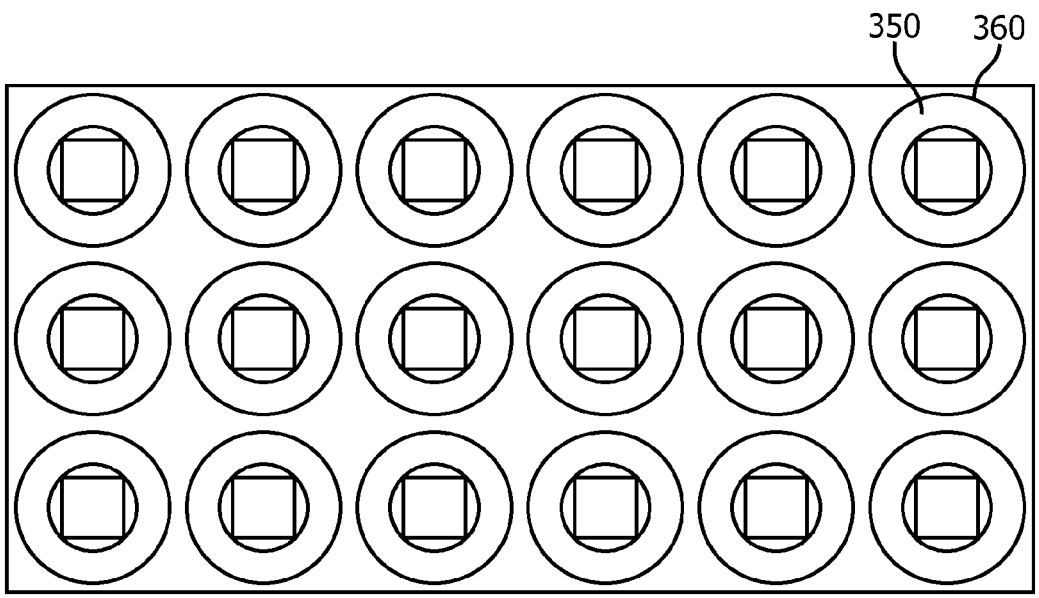

One of skill in the art will recognize that any of a variety of shapes may be used to form the reflective structures. FIG. 3A, for example, illustrates a reflective surface 350 that is curved, as compared to the planar surface 250 of FIG. 2A. In like manner, FIG. 3B illustrates a structure 360 that is circular, viewed from the top.

Figure 3C:
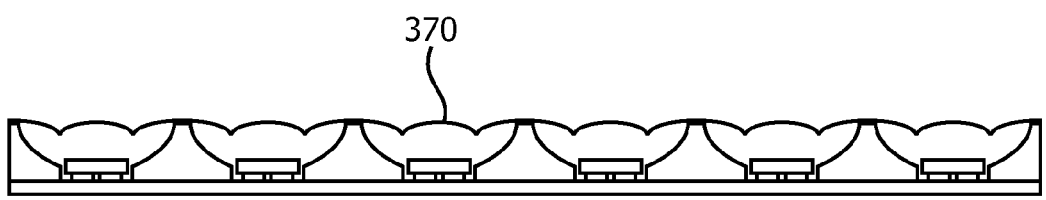

The encapsulant may also be formed in a variety of shapes to achieve a desired optical effect. For example, the encapsulant may be domed, similar to the domed shape of the encapsulant 170 in FIG. 1 that serves to spread the light output across a wide output angle. FIG. 3C, on the other hand, illustrates a more complex shape that serves to extract light in combination with the reflector and provides a directed light output.

Figure 4:
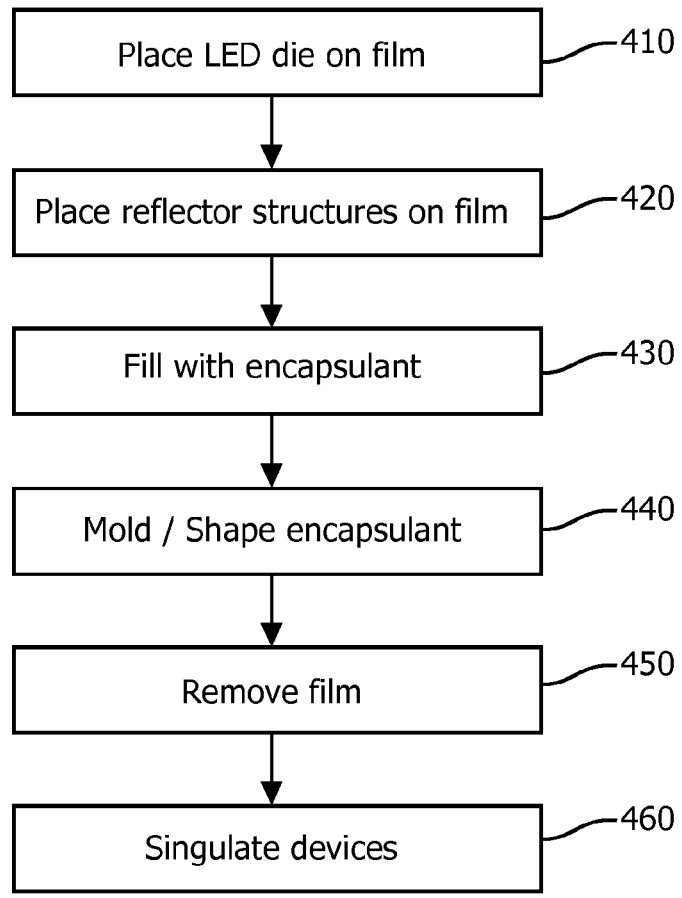
FIG. 4 illustrates an example flow diagram for providing light emitting devices having an integral reflective structure.

FIG. 4 illustrates an example flow diagram to facilitate the manufacture of a light emitting device with integral reflective structure. At 410, the light emitting elements are placed on a film, and at 420, reflective structures, with apertures for the light emitting elements are placed or formed on the film.

One of skill in the art will recognize that the order of this placement and/or formation may be reversed, in that the structures may be provided or formed on the film, and light emitting elements may be placed within apertures provided for receiving the light emitting elements. In like manner, the placement of the structures on the film may be effected by applying the film to a lower surface of a frame of reflective structures.

In an embodiment wherein a shape of the lower end of the aperture corresponds to the shape of the light emitting element, the aperture can provide the reference datum for placing each light emitting element, thereby facilitating an accurate placement of each light emitting element in a conventional pick-and-place process.

With the reflective structure and light emitting elements situated at their desired relative locations on the film, an encapsulant is placed within the reflective structure, at 430. Generally, the encapsulant will fill the structure, but the desired light output characteristics may call for a partial fill of the structure. At 440, the encapsulant may be molded to a desired shape, again dependent upon the desired light output characteristics.

Optionally, other elements may be added to the structure, before, during, or after encapsulation. For example, a wavelength conversion element, such as a phosphor, may be added as a discrete element that is situated atop the light emitting element or atop the encapsulant, or layered/sandwiched by the encapsulant, or, the phosphor may be embedded within the encapsulant.

With the light emitting element affixed to the reflective structure, the film may be removed, at 450, typically to expose the contacts on the light emitting elements. Alternatively, the film may include conductive traces that serve to provide connections to the light emitting elements, and in such an embodiment, the film would not be removed. It may then be affixed to a metal strip that serves as a heat sink. LEDs can be soldered, attached using silver paste to the traces on the film, or electrically connected using microsprings or microbumps.

At 460, the plurality of reflective structures and light emitting elements are separated, or 'singulated', into individual light emitting devices. This singulation will depend upon the nature of the reflective structures. If, at 420, the structures are placed individually upon the film, or formed on the film as individual structures, the removal of the film at 450 will effect this singulation. Alternatively, if a frame of structures is formed or placed on the film, this singulation is effected by appropriately slicing/dicing the frame. One of skill in the art will recognize that this slicing/dicing of the frame can be facilitated by forming separation features on the frame, such as score lines or grooves.

Of particular note, if the material used as the reflective structure is suitable to exposure to the intended operational environment for the singulated light emitting devices, there are no further processes required to further 'package' the device. Even though the example embodiments illustrate a frame of structures that is designed to minimize the space between the reflective structures, one of skill in the art will recognize that the shape of the structures may be made to conform to a desired overall package shape of the singulated light emitting devices. That is, the size and shape of the cavity of each reflective structure in which the light emitting element may be based on the desired light output characteristics, while the exterior size and shape of each reflective surface may be based on the desired package characteristics.

While the invention has been illustrated and described in detail in the drawings and foregoing description, such illustration and description are to be considered illustrative or exemplary and not restrictive; the invention is not limited to the disclosed embodiments.

Figure 5A:
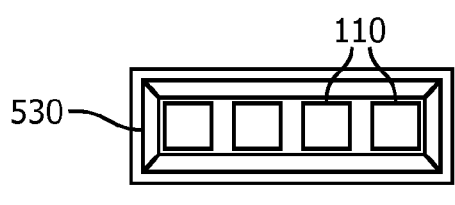
FIGS. 5A-5B illustrate example structures for light emitting devices with multiple light emitting elements.
Figure 5B:
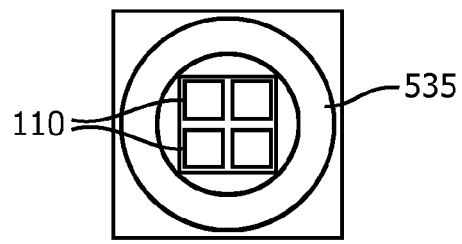

For example, although the example embodiments have included a one-to-one correspondence between light emitting elements and reflective structures, and symmetric reflective structures, one of skill in the art will recognize that these are not limiting features. FIG. 5A illustrates, for example, a 'light bar' embodiment wherein a rectangular reflective structure 530 encloses a plurality of light emitting elements 110. In like manner, FIG. 5B illustrates a circular reflective structure 535 that encloses a plurality of light emitting elements 110. Optionally, the bottom side of the reflective material may be patterned for ease of solderability, with features that facilitate self-alignment.

In either of the examples of FIG. 5A or 5B, the plurality of light emitting elements 110 may be situated on a common substrate with contacts that are commonly coupled to multiple elements 110. Alternatively, each element 110 may be situated directly on the film to facilitate independent coupling to an external power source. Other methods of accommodating multiple light emitting elements within a reflective structure will be evident to one of skill in the art in view of this disclosure.

Other variations to the disclosed embodiments can be understood and effected by those skilled in the art in practicing the claimed invention, from a study of the drawings, the disclosure, and the appended claims. For example, although the reflective structures in the example embodiments include a larger light output area than the light input area, one of skill in the art will recognize that the size and shape of the reflective structures will generally depend upon the desired light output characteristics from the particular light emitting elements, and may take any of a variety of forms.

In interpreting these claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) each of the disclosed elements may be comprised of hardware portions (e.g., including discrete and integrated electronic circuitry), software portions (e.g., computer programming), and any combination thereof;

f) hardware portions may include a processor, and software portions may be stored on a non-transient computer-readable medium, and may be configured to cause the processor to perform some or all of the functions of one or more of the disclosed elements;

g) hardware portions may be comprised of one or both of analog and digital portions;

h) any of the disclosed devices or portions thereof may be combined together or separated into further portions unless specifically stated otherwise;

i) no specific sequence of acts is intended to be required unless specifically indicated; and j) the term "plurality of" an element includes two or more of the claimed element, and does not imply any particular range of number of elements; that is, a plurality of elements can be as few as two elements, and can include an immeasurable number of elements.

I claim:

1. A method comprising:
providing a removable film having a substantially smooth surface,
providing a plurality of light emitting elements, each of the light emitting elements having contacts situated on a surface of the light emitting elements opposite a light emitting surface of the light emitting elements,
situating each of the plurality of light emitting elements on the removable film such that the contacts are situated on the surface of the removable film,
adding a plurality of reflective structures to the removable film, the reflective structures being situated on the film so as to reflect light from one or more of the light emitting elements in an intended light output direction,
adding an encapsulant within the reflective structures so as to affix the reflective structures to the corresponding one or more of the light emitting elements,
singulating the plurality of reflective structures to provide a light emitting device comprising the one or more light emitting elements affixed to each reflective structure, and
removing the film after adding the encapsulant, exposing the contacts of each of the light emitting elements.

2. The method of claim 1, where the reflective structure includes a sacrificial material attached to the film, and the method includes removing the sacrificial material.

3. The method of claim 1, including shaping a light output surface of the encapsulant to form a planar surface.

4. The method of claim 1, including shaping a light output surface of the encapsulant to form a non-planar surface.

5. The method of claim 1, wherein adding the plurality of reflective structures to the film includes attaching a frame comprising the plurality of reflective structures to the film.

6. The method of claim 1, wherein adding the plurality of reflective structures to the film includes forming the plurality of reflective structures on the film.

7. The method of claim 1, wherein the plurality of reflective structures on the film provide a reference datum for situating the plurality of light emitting elements on the film.

8. The method of claim 1, including adding a plurality of wavelength conversion elements.

9. The method of claim 1, wherein removing the removable film also exposes surfaces of the reflective structures surrounding the light emitting elements.

10. The method of claim 1, wherein the reflective structures surround the contacts of each of the light emitting elements.

11. A structure comprising:
a removable film having a substantially smooth surface,
a plurality of light emitting elements on the removable film, each light emitting element having contacts situated on a surface of the light emitting elements opposite a light emitting surface of the light emitting elements, the contacts also being situated on the surface of the removable film,
a plurality of reflective structures on the removable film, the reflective structures being situated on the film so as to reflect light from one or more of the light emitting elements in an intended light output direction, and
an encapsulant within the reflective structures that affixes the corresponding one or more of the light emitting elements within an aperture that extends through the reflective structures;
wherein removal of the removable film from each of the light emitting elements exposes the contacts of the light emitting element to facilitate electrical coupling to the light emitting element.

12. The structure of claim 11, wherein a light output surface of the encapsulant is planar.

13. The structure of claim 11, wherein a light output surface of the encapsulant is non-planar.

14. The structure of claim 11, including a plurality of wavelength conversion elements.

15. The structure of claim 11, wherein the plurality of reflective structures include a surface layer that is situated on the surface of the film, the surface layer comprising a sacrificial material that facilitates removal of the surface layer.

16. The structure of claim 11, wherein the removal of the removable film also exposes surfaces of the reflective structures surrounding the light emitting elements.

17. The structure of claim 11, wherein the reflective structures surround the contacts of each of the light emitting elements.

* * * * *